US010365332B2

(12) United States Patent
Gorbold

(10) Patent No.: US 10,365,332 B2
(45) Date of Patent: Jul. 30, 2019

(54) SYSTEM AND METHOD TO REDUCE DATA HANDLING ON LITHIUM ION BATTERY MONITORS

(71) Applicant: ANALOG DEVICES GLOBAL UNLIMITED COMPANY, Hamilton (BM)

(72) Inventor: Jeremy R. Gorbold, Newbury (GB)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 678 days.

(21) Appl. No.: 14/034,553

(22) Filed: Sep. 24, 2013

(65) Prior Publication Data

US 2014/0129164 A1    May 8, 2014

Related U.S. Application Data

(60) Provisional application No. 61/721,842, filed on Nov. 2, 2012, provisional application No. 61/836,215, filed on Jun. 18, 2013.

(51) Int. Cl.
*G01R 31/396* (2019.01)
*G01R 31/3835* (2019.01)

(52) U.S. Cl.
CPC ........ *G01R 31/3835* (2019.01); *G01R 31/396* (2019.01)

(58) Field of Classification Search
CPC .......................... G01R 31/362; G01R 31/3658
See application file for complete search history.

(56) References Cited

U.S. PATENT DOCUMENTS 4,388,582 A * 6/1983 Saar ...................... H02J 7/0083
                                                              320/125
5,047,961 A * 9/1991 Simonsen .......... G01R 31/3648
                                                              702/63

(Continued)

OTHER PUBLICATIONS

Steven Corrigan (Introduction to the Controller Area Network (CAN)).*

(Continued)

*Primary Examiner* — Gregory J Toatley, Jr.
*Assistant Examiner* — Brandon J Becker
(74) *Attorney, Agent, or Firm* — Patent Capital Group

(57) ABSTRACT

An example method to reduce data handling on lithium ion battery monitors is provided and includes receiving a request from a micro-controller for data associated with one or more cells, receiving signals corresponding to monitored properties from the cells, calculating derivative properties from the monitored properties, dividing a default data into a plurality of portions, and sending the derivative properties and one of the portions to the micro-controller according to at least a first compute logic option or a second compute logic option. The default data can include cell voltages, auxiliary inputs, stack voltage, reference output voltage, analog voltage output, analog voltage input, temperature, and reference buffer voltage. The default data is provided sequentially to the micro-controller in as many consecutive read backs as the number of portions, where each portion corresponds to the default data measured at a distinct time instant.

20 Claims, 5 Drawing Sheets

(56) References Cited

U.S. PATENT DOCUMENTS

| | | | | |
|---|---|---|---|---|
| 5,257,007 A * | 10/1993 | Steil | G08B 25/10 | |
| | | | 340/531 | |
| 5,440,221 A * | 8/1995 | Landau | H01M 10/425 | |
| | | | 320/155 | |
| 5,646,534 A * | 7/1997 | Kopera | G01R 31/3648 | |
| | | | 324/434 | |
| 5,670,861 A * | 9/1997 | Nor | G01R 31/3648 | |
| | | | 320/118 | |
| 5,825,155 A * | 10/1998 | Ito | G01R 19/16542 | |
| | | | 320/118 | |
| 6,055,619 A * | 4/2000 | North | G10H 7/002 | |
| | | | 704/270 | |
| 6,140,820 A * | 10/2000 | James | G01R 19/16542 | |
| | | | 324/434 | |
| 6,242,891 B1 * | 6/2001 | Parsonage | G01R 19/16542 | |
| | | | 320/132 | |
| 6,611,774 B1 * | 8/2003 | Zaccaria | G01R 31/3648 | |
| | | | 702/63 | |
| 7,564,216 B2 | 7/2009 | Carrier et al. | | |
| 8,253,383 B2 | 8/2012 | Li | | |
| 2003/0076250 A1 * | 4/2003 | Enochson | H03M 1/004 | |
| | | | 341/120 | |
| 2003/0178533 A1 * | 9/2003 | Kornick | B61L 3/127 | |
| | | | 246/187 A | |
| 2005/0043606 A1 * | 2/2005 | Pewzner | A61B 5/0261 | |
| | | | 600/407 | |
| 2005/0151657 A1 * | 7/2005 | Lockhart | G01R 19/16542 | |
| | | | 340/636.1 | |
| 2006/0071643 A1 * | 4/2006 | Carrier | H01M 10/4257 | |
| | | | 320/132 | |
| 2007/0103113 A1 * | 5/2007 | Embrey | H02J 7/0011 | |
| | | | 320/112 | |
| 2007/0182377 A1 * | 8/2007 | Vandensande | G01R 31/396 | |
| | | | 320/132 | |
| 2008/0014484 A1 * | 1/2008 | Ronne | B60L 3/0046 | |
| | | | 429/431 | |
| 2009/0039833 A1 * | 2/2009 | Kitagawa | H01M 10/46 | |
| | | | 320/134 | |
| 2009/0315519 A1 * | 12/2009 | Izumi | B60L 11/1868 | |
| | | | 320/134 | |
| 2010/0190041 A1 * | 7/2010 | Hou | H01M 10/482 | |
| | | | 429/50 | |
| 2011/0047630 A1 * | 2/2011 | Cheng | H04L 9/3234 | |
| | | | 726/34 | |
| 2011/0076530 A1 * | 3/2011 | Miyamoto | H01M 10/4207 | |
| | | | 429/61 | |
| 2012/0012975 A1 * | 1/2012 | Inoue | H01L 21/761 | |
| | | | 257/528 | |
| 2012/0203482 A1 * | 8/2012 | Parle | G01R 31/3658 | |
| | | | 702/63 | |
| 2013/0041538 A1 * | 2/2013 | Jin | B60L 50/64 | |
| | | | 701/22 | |
| 2013/0187610 A1 | 7/2013 | Hayashi et al. | | |

OTHER PUBLICATIONS

Office Action (OA1) issued in CN Patent Application Serial No. 201310533748.3 dated Dec. 3, 2015, 8 pages.

Linear Technology, *LTC6802-1, Multicell Battery Stack Monitor*, © Linear Technology Corporation 2009, 38 pages.

Office Action (OA2) issued in CN Patent Application Serial No. 201310533748.3 dated May 18, 2016, 4 pages. [includes EN Summary of Relevance].

Office Action (OA1) issued in DE Patent Application Serial No. 102013111632.9 dated Sep. 14, 2016, 10 pages.

English Summary of Office Action (OA1) issued in DE Patent Application Serial No. 102013111632.9 dated Sep. 14, 2016, 10 pages.

*Lithium Ion Battery Monitoring System*, Analog Devices, © 2011 Analog Devices, Inc., 48 pages [cited in DE OA1 mailed Sep. 14, 2016].

* cited by examiner

FIG. 4

| K | $C_K$ | SIGNAL |
|---|---|---|
| 1 | MINIMUM, MAXIMUM, AVERAGE | CELL1 |
| 2 | MINIMUM, MAXIMUM, AVERAGE | CELL2 |
| 3 | MINIMUM, MAXIMUM, AVERAGE | CELL3 |
| ... | ... | ... |
| 13 | MINIMUM, MAXIMUM, AVERAGE | STACK |
| ... | ... | ... |
| 18 | MINIMUM, MAXIMUM, AVERAGE | AUX3 |
| ... | ... | ... |
| 23 | MINIMUM, MAXIMUM, AVERAGE | VREG |
| 24 | MINIMUM, MAXIMUM, AVERAGE | TEMP SENSOR |

| K | $C_K$ | SIGNAL |
|---|---|---|
| 1 | MINIMUM | CELL1 |
| 2 | MAXIMUM | CELL2 |
| 3 | AVERAGE | CELL3 |
| ... | ... | ... |
| 13 | MINIMUM | STACK |
| ... | ... | ... |
| 18 | AVERAGE | AUX3 |
| ... | ... | ... |
| 23 | MAXIMUM | VREG |
| 24 | AVERAGE | TEMP SENSOR |

62

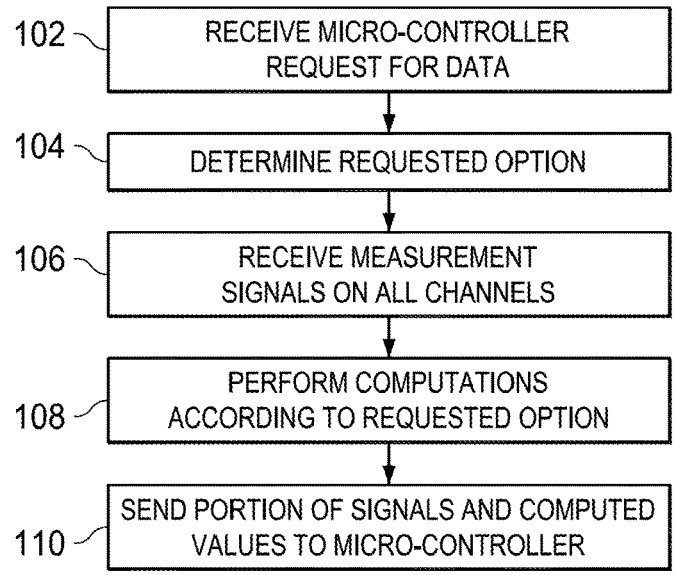
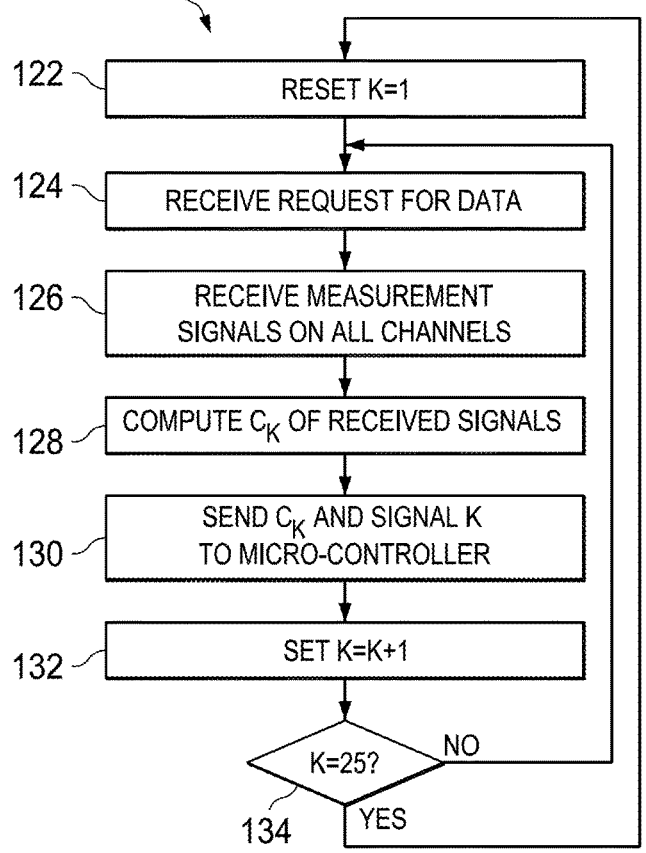

SYSTEM AND METHOD TO REDUCE DATA HANDLING ON LITHIUM ION BATTERY MONITORS

CROSS-REFERENCE TO RELATED APPLICATION

This application claims the benefit of priority under 35 U.S.C. § 119(e) to U.S. Provisional Application Ser. No. 61/721,842, entitled "SYSTEM AND METHOD TO REDUCE DATA HANDLING ON LITHIUM ION BATTERY MONITORS" filed Nov. 2, 2012, and to U.S. Provisional Application Ser. No. 61/836,215, entitled "SYSTEM AND METHOD TO REDUCE DATA HANDLING ON LITHIUM ION BATTERY MONITORS" filed Jun. 18, 2013, which are hereby incorporated by reference in their entireties.

TECHNICAL FIELD

This disclosure relates in general to the field of electronic processing systems and, more particularly, to a system and method to reduce data handling on lithium ion battery monitors.

BACKGROUND

The emergence of small lightweight long-running lithium ion batteries has facilitated a market for notebook computers, cell phones, and other portable devices. Lithium ion battery technology is also increasingly used in cars, such as hybrid vehicles that run on electricity powered by such batteries and gasoline, and electric cars that run exclusively on electricity generated by such batteries. Battery technology continues to expand to other areas, such as data centers, manufacturing and industrial applications, where hybrid power management requires extended battery life. In such battery powered systems, battery management can be important, for example, to ensure proper performance of the battery system while maintaining energy economy and overall system performance. An intelligent battery management system can lengthen battery life, reducing the system cost over its entire lifetime. The battery management system controls the functionality and charge of the battery cells. As the cells age, the storage capacity of the individual battery cells may lessen. The battery management system optimizes cell utilization considering the battery cell performance and battery life.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 4 is a simplified diagram illustrating yet other details of an embodiment of the system;

FIG. 5 is a simplified diagram illustrating yet other details of an embodiment of the system;

FIG. 6 is a simplified flow diagram illustrating example operations that may be associated with an embodiment of the system; and FIG. 7 is a simplified flow diagram illustrating other example operations that may be associated with an embodiment of the system.

DETAILED DESCRIPTION OF EXAMPLE EMBODIMENTS

Overview

An example method to reduce data handling on lithium ion battery monitors is provided and includes receiving a request from a micro-controller for data associated with one or more cells, receiving signals corresponding to monitored properties from the cells, calculating derivative properties from the monitored properties, dividing a default data into a plurality of portions, and sending a first set of the derivative properties and one of the portions of the default data to the micro-controller according to at least a first compute logic option or a second compute logic option. Substantially all the default data may be provided to the micro-controller in as many consecutive read backs as a number of portions.

In specific embodiments, the default data comprises: cell voltages, auxiliary inputs, stack voltage, reference output voltage ($V_{REF}$), analog voltage output ($V_{REGOUT}$), analog voltage input ($V_{REGIN}$), temperature of the battery monitor, and reference buffer voltage ($V_{REFBUF}$). In some embodiments, according to the first compute logic option, the first set includes the following derivative properties: minimum cell voltage, maximum cell voltage, average cell voltage, and the second set includes one of the default data. According to the second compute logic option, the first set includes one of minimum cell voltage, maximum cell voltage, and average cell voltage, and the second set includes one of the default data.

In some embodiments, according to the first compute logic option, the requested data is provided to the micro-controller on four channels in two 64 bit frames. According to the second compute logic option, the requested data is provided to the micro-controller on two channels in a single 64 bit frame.

Example Embodiments

Figure 1:
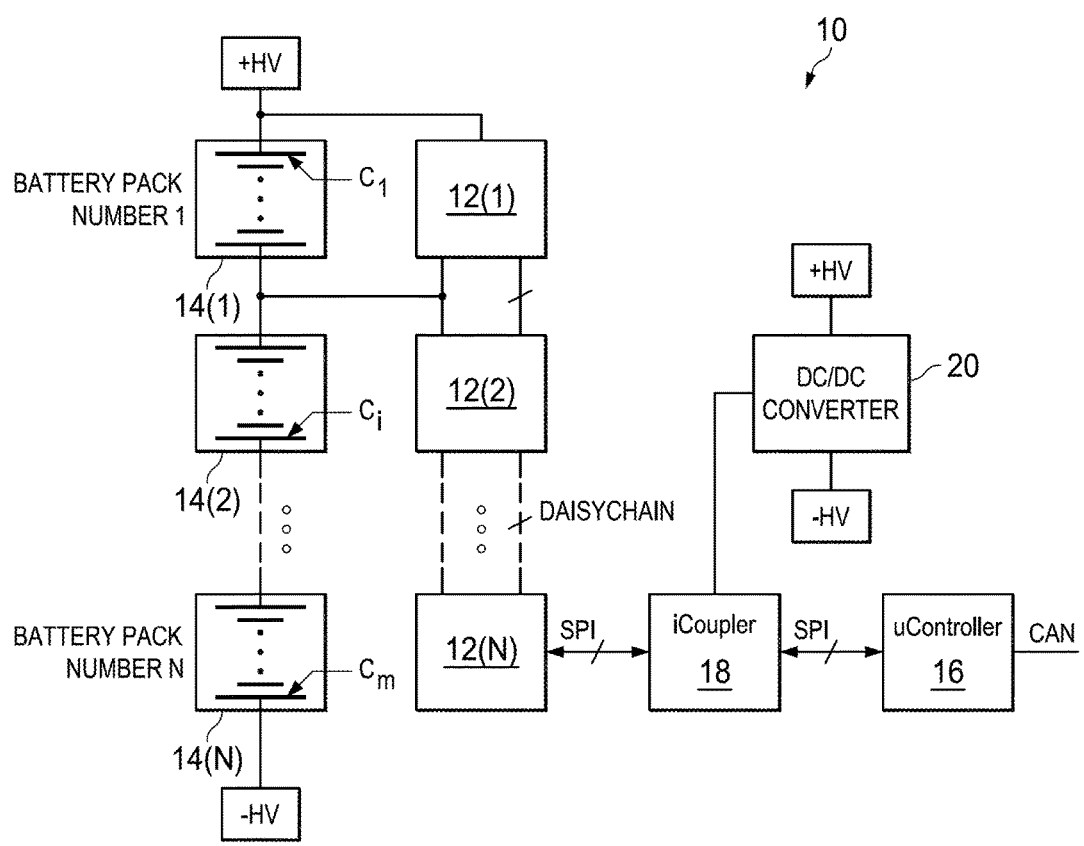
FIG. 1 is a simplified block diagram of a system to reduce data handling on lithium ion battery monitors in accordance with one embodiment.

Turning to FIG. 1, FIG. 1 is a simplified block diagram of a system 10 to reduce data handling on lithium ion battery monitors. System 10 includes a chain of battery monitors 12(1)-12(N), each of which is configured to monitor a predetermined number of cells $C_1$ to $C_m$ in battery packs 14(1)-14(N). As used herein, the term "cell" includes a device capable of changing some form of energy into another form. Examples of cells include electrochemical cells (e.g., that change chemical energy into electrical energy), photovoltaic cells (e.g., that change light energy into electrical energy), etc. A lithium ion battery is an example of an electrochemical cell, where a negative electrode (anode) and positive electrode (cathode) materials serve as hosts for lithium ions (Li+). Lithium ions move from the anode to the cathode during discharge and are intercalated into (e.g., inserted into voids in the crystallographic structure of) the cathode. The ions reverse direction during charging. The term "battery monitor" encompasses any electronic component (e.g., electronic circuit, integrated circuit, or semiconductor chip), device, or application capable of monitoring one or more properties of cells C. The monitored properties can include voltage, charge, temperature, current, physical integrity, and such other properties.

The number of cells C (the term C is used herein to refer to one or more cells in a general sense) as used monitored by each battery monitor 12(1)-12(N) may range from 1 to 12 or higher, limited by a pin count of a semiconductor chip on which a specific battery monitor is provided, or the voltage range that can be handled by the specific battery monitor. Each battery pack 14(1)-14(N) may comprise the same or different number of cells C physically enclosed together in a container. The term "battery" and "battery pack" may be interchangeably used herein. Battery monitors 12(1)-12(N) may be connected in a daisy chain, with suitable connections for data transfer between pairs of adjacent battery monitors. A micro-controller 16 may control battery monitors 12(1)-12(N) over a communication channel, such as a Serial Peripheral Interface (SPI) compatible connection. An iCoupler 18 may facilitate isolating battery packs 14(1)-14(N) and battery monitors 12(1)-12(N) from micro-controller 16 and other components of system 10. An optional DC/DC converter 20 may power iCoupler 18 in some embodiments.

According to embodiments of the present disclosure, micro-controller 16 may send control data to battery monitors 12(1)-12(N) requesting data associated with one or more cells C. As used herein, the term "control data" includes address information identifying a particular cell $C_i$ or battery pack 14(1)-14(N), and/or control information indicating an operation to be performed in connection with the data. The requested data can include values of monitored properties (e.g., properties of cells C monitored by battery monitors 12(1)-12(N)), and derivative properties (e.g., properties derived from the monitored properties).

The monitored properties can include cell voltages, auxiliary inputs (e.g., properties other than cell voltages, for example, thermistor termination resistor input), temperature of respective battery monitors 12(1)-12(N) and cross-check parameters (such as reference output voltage ($V_{REF}$), analog voltage output ($V_{REGOUT}$), analog voltage input ($V_{REGIN}$), temperature, reference buffer voltage ($V_{REFBUF}$) of battery monitors 12(1)-12(N)) used to perform safety checks on battery monitors 12(1)-12(N). The derivative properties derived from the monitored properties can include the stack voltage, comprising a sum of the cell voltages, minimum cell voltage (e.g., minimum of the cell voltages monitored by a specific battery monitor), maximum cell voltage (e.g., maximum of the cell voltages monitored by a specific battery monitor), and average cell voltage (average of the cell voltages monitored by a specific battery monitor). Various other derivative properties may be calculated from the monitored properties within the broad scope of the embodiments.

According to various embodiments, battery monitors 12(1)-12(N) may send a selected portion of the requested data to micro-controller 16. By sending a portion of the requested data, rather than all the requested data, the amount of data communicated to micro-controller 16 and consequent data handling requirements of micro-controller 16 may be reduced. With reduced data processing, micro-controller 16 may have increased bandwidth for performing faster computations and other functions more efficiently.

For purposes of illustrating the techniques of system 10, it is important to understand the operations of a given system such as the architecture shown in FIG. 1. The following foundational information may be viewed as a basis from which the present disclosure may be properly explained. Such information is offered earnestly for purposes of explanation only and, accordingly, should not be construed in any way to limit the broad scope of the present disclosure and its potential applications.

Lithium-ion batteries in hybrid and electric vehicles can be generally monitored and managed by off-the-shelf battery monitors and micro-controllers available from a variety of manufacturers (e.g., Analog Devices AD7280A; Linear Technology LTC6802-1; Maxim DS2438; Texas Instruments bq76PL536; etc.) Typically, most of the battery monitors contain functions for general-purpose monitoring of stacked lithium ion batteries as used in hybrid electric vehicles, battery backup applications, and power tools. A battery management system may receive measured values of cell properties from the battery monitors and perform various functions, such as monitoring the conditions of individual cells within the battery packs; maintaining the cells within their operating limits; protecting the cells from out-of-tolerance conditions; providing a "Fail Safe" mechanism in case of uncontrolled conditions, loss of communications or abuse; isolating the battery in cases of emergency; compensating for any imbalances in cell parameters within the battery chain; providing information on the State of Charge (SOC) of the battery (e.g., Fuel Guage); providing information on the State of Health (SOH) of the battery; providing information for driver displays and alarms; predicting the range possible with the remaining charge in the battery; accepting and implementing control instructions from related vehicle systems; etc.

The battery management system includes a battery monitoring unit (comprising one or more monitoring battery monitors) whose main functions are data collection, data processing, data transmission, and control. Monitored data from the battery monitoring unit is fed to a micro-controller in the battery management system. The micro-controller analyzes the data and extracts information for battery protection and state of charge determination. Some of the analyzed information may also be passed to a Controller Area Network (CAN) bus (a vehicle bus standard to allow micro-controllers and devices (such as battery generators) to communicate with each other within a vehicle without a host computer).

To reduce costs, instead of monitoring each cell in parallel, the typical battery monitor may incorporate a multiplexing architecture, which switches the voltage from each cell in turn to a single analog or digital output line. Cost savings can be realized by reducing the number of analog control and/or digital sampling circuits and keeping the component count to a minimum. A high speed switching mechanism in the multiplexer switches the output line to each cell so that the cells can be monitored sequentially.

Multiple battery packs may be monitored using multiple battery monitors by coupling the battery monitors together in a suitable manner. In some systems, a daisy-chain interface allows several battery monitors to be stacked without the need for individual device isolation. Each link between adjacent battery monitors may support bi-directional transfer of monitored and control data in a serial and/or parallel fashion. For example, data produced by a battery monitor in may be transferred down to the next adjacent battery monitor m−1 in the chain of battery monitors that is closer to the micro-controller. Control data from the micro-controller may be transferred in the opposite direction.

Some battery monitors (e.g., AD7283) measure 12 cells and uses 24 channels to read back in twelve 64 bit frames. As used herein, the term "read back" includes a response to a request for data from the micro-controller. A typical 24 output read back comprising 32 bits measurement values may take 1.56 ms at 750 kHz maximum speed for data communication to the micro-controller. The 24 values on each read back may also be more than needed for the micro-controller to perform its functions. Assuming 8 battery packs are monitored, with 96 cells total, the time for read back on primary channels may be 8.5 ms, and on both primary and secondary (e.g., channel to provide redundancy in the system) may be 14.1 ms.

System 10 is configured to address these issues (and others) in offering a more data efficient battery management system. In various embodiments, battery monitors 12(1)-12(N) may be configured with one or more compute logic options to provide selected portions of the requested data to micro-controller 16. Battery monitors 12(1)-12(N) may receive control data comprising a request for data from micro-controller 16. In some embodiments, the control data may specify that the data be provided according to one of the compute logic options. Battery monitors 12(1)-12(N) may receive signals corresponding to monitored properties from the cells C. The signals may include electrical signals at certain voltage, or current. Battery monitors 12(1)-12(N) may calculate derivative properties from the monitored properties. Battery monitors 12(1)-12(N) may determine a default data to be provided to micro-controller 16, and divide the default data into a plurality of portions.

In one embodiment, the "default data" includes the following monitored properties and derivative properties monitored and/or derived by each battery monitor 12(1)-12(N): cell voltages, auxiliary inputs, stack voltage (i.e., sum of the cell voltages), $V_{REF}$, $V_{REGIN}$, $V_{REGOUT}$, $V_{REFBUF}$, and temperature of the battery monitor. Various other monitored and/or derivative properties, including more than or less than the number of properties listed herein, may be included in the default data within the broad scope of the embodiments.

Battery monitors 12(1)-12(N) may send the derivative properties and one of the portions of the default data to the micro-controller according to the compute logic option. The default data may be provided sequentially to micro-controller 16 one portion at a time in as many consecutive read backs as a number of the portions. In example embodiments, the compute logic options may comprise a first compute logic option and a second compute logic option. In some embodiments, a default compute logic option may also be provided, wherein substantially all the default data may be provided to micro-controller 16 in a single read back.

According to the first compute logic option, the derivative properties may comprise: minimum cell voltage, maximum cell voltage, average cell voltage; the one of the portions of the default data (sent to micro-controller 16) may comprise one of the default data. According to the second compute logic option, the derivative properties may comprise one of minimum cell voltage, maximum cell voltage, and average cell voltage; and the one of the portions of the default data (sent to micro-controller 16) may comprise one of the default data. Various other options comprising various selections of portions of monitored and derivative properties may be provided to micro-controller 16 within the broad scope of the embodiments.

For example, battery monitors 12(1)-12(N) may monitor charging of battery packs 14(1)-14(N) by monitoring the cell voltage and temperature affecting cells C, among other properties, as specified by appropriate control data from micro-controller 16. The control data may specify the particular option (e.g., first compute logic option) according to which to send the requested data. A portion of the requested data, say SIGNAL(1,1), may be transmitted to micro-controller 16 from battery monitors 12(1)-12(N) through the daisy chain connection in four channels comprising two 64 bit frames, where SIGNAL(1,1) comprises {minimum cell voltage, maximum cell voltage, average cell voltage and cell voltage of cell 1}.

Based on the portion of requested data received, micro-controller 16 may attempt to make a determination that a specific cell $C_i$ has reached a predetermined voltage at a particular temperature. In some embodiments, if the determination cannot be made, a second request may be sent by micro-controller 16 to one or more of battery monitors 12(1)-12(N). In other embodiments, the second request may be sent irrespective of any determination by micro-controller 16. In the second read back, another portion of the requested data, say SIGNAL(2,1), may be transmitted to micro-controller 16 from battery monitors 12(1)-12(N) through the daisy chain connection, where SIGNAL(2,1) comprises {minimum cell voltage, maximum cell voltage, average cell voltage and cell voltage of cell 2}, and so on, until substantially all default data may be provided to micro-controller 16 in as many read backs (e.g., 24 default data may be provided in 24 read backs). The next read back (e.g., read back 25) may wrap round to the beginning again and continue thereafter. Based on the received data, micro-controller 16 may produce control data identifying the specific cell $C_i$ and instructing the applicable battery monitor to prevent the specific cell $C_i$ from being further charged.

In an example embodiment, the operations would occur in a sequence as follows: A first convert signal may be received at battery monitors 12(1)-12(N) from micro-controller 16. Battery monitors 12(1)-12(N) may convert substantially all cells, auxiliary data, etc., and calculate derivate data based on a first measured data set. Battery monitors 12(1)-12(N) may read back SIGNAL(1,1) comprising {minimum cell voltage, maximum cell voltage, average cell voltage and cell voltage of cell 1} at time t1 on receipt of a first read signal from micro-controller 16.

A second convert signal may be received at battery monitors 12(1)-12(N) from micro-controller 16. Battery monitors 12(1)-12(N) may convert substantially all cells, auxiliary data, etc., and calculate derivate data based on a second measured data set. Battery monitors 12(1)-12(N) may read back SIGNAL(2,1) comprising {minimum cell voltage, maximum cell voltage, average cell voltage and cell voltage of cell 2} at time t2 on receipt of a second read signal from micro-controller 16.

A third convert signal may be received at battery monitors 12(1)-12(N) from micro-controller 16. Battery monitors 12(1)-12(N) may convert substantially all cells, auxiliary data, etc., and calculate derivate data based on a third measured data set. Battery monitors 12(1)-12(N) may read back SIGNAL(3,1) comprising {minimum cell voltage, maximum cell voltage, average cell voltage and cell voltage of cell 3} at time t3 on receipt of a third read signal from micro-controller 16. The operations may continue until substantially all channels have been converted and read. The next read back may loop back to the beginning (e.g., channel 1), and continue thereafter. Thus, for any one conversion (e.g., convert signal from micro-controller 16), the read back may comprise a full derivative data set (e.g., comprising minimum cell voltage, maximum cell voltage, average cell voltage), and one portion of the default data (e.g., cell voltage of a specific cell) measured at any particular time instant.

In another example, according to the second compute logic option, a portion of the data, say SIGNAL(1,2), may be transmitted to micro-controller 16 from battery monitors 12(1)-12(N) through the daisy chain connection in two channels comprising one 64 bit frames, where SIGNAL(1,2) comprises one of {minimum cell voltage, maximum cell voltage, average cell voltage} and another of the default data. A first output channel may provide one of minimum cell voltage, maximum cell voltage, and average cell voltage; a second output channel may provide one of the default data. At each read back, each channel may increment to the next available data and continue until substantially all default data have been provided. In some embodiments, all three options (e.g., default option, first compute logic option and second compute logic option) may be provided in each battery monitor 12(1)-12(N). Micro-controller 16 may request data according to the default option, or the first compute logic option, or the second compute logic option. In other embodiments, only the first compute logic option or the second compute logic option may be provided in each battery monitor 12(1)-12(N).

In an example embodiment, the operations would occur in a sequence as follows: A first convert signal may be received at battery monitors 12(1)-12(N) from micro-controller 16. Battery monitors 12(1)-12(N) may convert substantially all cells, auxiliary data, etc., and calculate derivate data based on a first measured data set. Battery monitors 12(1)-12(N) may read back SIGNAL(1,2) comprising {minimum cell voltage and cell voltage of cell 1} at time t1 on receipt of a first read signal from micro-controller 16.

A second convert signal may be received at battery monitors 12(1)-12(N) from micro-controller 16. Battery monitors 12(1)-12(N) may convert substantially all cells, auxiliary data, etc., and calculate derivate data based on a second measured data set. Battery monitors 12(1)-12(N) may read back SIGNAL(2,2) comprising {maximum cell voltage and cell voltage of cell 2} at time t2 on receipt of a second read signal from micro-controller 16.

A third convert signal may be received at battery monitors 12(1)-12(N) from micro-controller 16. Battery monitors 12(1)-12(N) may convert substantially all cells, auxiliary data, etc., and calculate derivate data based on a third measured data set. Battery monitors 12(1)-12(N) may read back SIGNAL(3,2) comprising {average cell voltage and cell voltage of cell 3} at time t3 on receipt of a third read signal from micro-controller 16. The operations may continue until substantially all channels have been converted and read. The next read back may loop back to the beginning (e.g., channel 1), and continue thereafter. Thus, for any one conversion (e.g., convert signal from micro-controller 16), the read back may comprise a partial derivative data set (e.g., comprising minimum cell voltage, maximum cell voltage, or average cell voltage), and one portion of the default data (e.g., cell voltage of a specific cell) measured at a particular time instant.

On chip data pre-processing in battery monitors 12(1)-12(N) according to embodiment of system 10 may eliminate a need for reading conversion results on every conversion (e.g. saving approximately 100 ms). On chip data pre-processing may provide minimum cell voltage, maximum cell voltage and average cell voltage as monitored by each battery monitor 12(1)-12(N). The monitored parameters from substantially all cells in the form of default data may be accessed less frequently. Embodiments of system 10 may reduce communication load between micro-controller 16 and the chain of battery monitors 12(1)-12(N).

In various embodiments, micro-controller 16 and the rest of the battery management system may have results from the cross check that can be used to validate that battery monitors 12(1)-12(N) function correctly on at least one out of substantially all conversions of the default data. For example, the temperature may be monitored and the cell voltages may be checked to determine if they fit within the limits of the minimum cell voltage, maximum cell voltage and the average cell voltage.

Moreover, other variations can include providing the requested data to micro-controller 16 in three 64 bit frames, bringing back more channels (or monitored and derivative properties) for example, while still reducing the communication bandwidth and data processing compared to sending all the default data. In other embodiments, possible pre-processed data read mode may use one write command to access the option followed up with reads from other battery monitors in the daisy chain. Still other variations may be encompassed within the broad scope of the embodiments.

Turning to the infrastructure of system 10, elements of FIG. 1 may be coupled to one another through one or more interfaces employing any suitable connection (wired or wireless), which provides a viable pathway for electronic communications. Additionally, any one or more of these elements may be combined or removed from the architecture based on particular configuration needs. In various embodiments, the elements of FIG. 1 may be coupled to each other over one or more printed circuit boards that provide viable paths for electronic communication. In other embodiments, some of the elements (e.g., battery monitors 12(1)-12(N), micro-controller 16) of FIG. 1 may be coupled to each other in a multi-chip module housed within a common electronic package. In yet other embodiments, some of the elements of FIG. 1 may be provisioned within the same semiconductor chip (e.g., in a system-on-chip configuration).

In various embodiments, each battery pack 14(1)-14(N) may each comprise several (e.g., 12) lithium-ion (or equivalent) battery cells. Each lithium-ion cell may include alternating layers of anode and cathode separated by a porous film (separator). A suitable electrolyte (e.g., composed of an organic solvent and dissolved lithium salt) may provide the medium for lithium ion transport. Each cell can be constructed by stacking alternating layers of electrodes, or by winding long strips of electrodes into a "jelly roll" configuration or any other suitable configuration. Electrode stacks or rolls can be inserted into hard cases that are sealed with gaskets (e.g., as in common commercial cylindrical cells), laser-welded hard cases, or enclosed in foil pouches with heat-sealed seams (commonly referred to as lithium-ion polymer cells). A variety of safety mechanisms (e.g., charge interrupt devices and positive temperature coefficient switches) may also be included in each cell. The cells may be connected in series (and/or parallel) within battery packs 14(1)-14(N) appropriately.

iCoupler 18 may provide galvanic isolation, blocking current from flowing between battery monitors 12(1)-12(N) and micro-controller 16, while allowing data to pass unimpeded. Isolation may be used to protect against high voltages or currents caused by line surges or ground loops, which can occur in any system that has multiple ground paths. In some embodiments, iCoupler 18 may comprise magnetic couplers based on chip-scale transformers. Circuitry on a primary side of the transformer may encode input logic transitions into 1 ns pulses, which are then coupled through the transformer; circuitry on the secondary side may detect them and recreate the input signal. In such transformer-based iCoupler 18, optional DC/DC converter 20 may not be needed.

In other embodiments, iCoupler 18 may comprise opto-couplers, comprising light emitting diodes (LEDs) and other photo-sensitive components. iCoupler 18 in such embodiments may comprise a source (emitter) of light that converts electrical input signal into light, a closed optical channel, and a photosensor, which detects incoming light and either generates electric energy directly, or modulates electric current flowing from an external power supply. The sensor can be a photoresistor, a photodiode, a phototransistor, a silicon-controlled rectifier (SCR), a triac or other suitable component. iCoupler 18 may connect input and output sides with a beam of light modulated by the input current. iCoupler 18 may transform the input signal into light, send it across the optical channel, capture light on the output side and transform it back into electric signal. In such embodiments, DC/DC converter 20 may be used by iCoupler to perform its functions.

According to various embodiments, micro-controller 16 may be included within a larger battery management system (not shown), communicating therewith over a CAN bus. The battery management system may use monitored values of the battery state (such as voltage, temperature, etc.) to decide and take actions, such as requesting a battery generator to charge one or more batteries, communicating with an emergency shutdown subsystem, etc. The centralized topology illustrated in FIG. 1 is merely for example purposes, and is not a limitation. In the centralized topology, micro-controller 16 acts as a central command, controlling all battery monitors 12(1)-12(N). In other embodiments, the topology may include a distributed approach, wherein a separate micro-controller controls each battery monitor 12(1)-12(N). In yet other embodiments, a modular topology comprising a mixture of centralized and distributed approach may be used, wherein several micro-controllers manage several ones of battery monitors 12(1)-12(N). The operations described herein may be extended to distributed and modular topologies within the broad scope of the embodiments.

Figure 2:
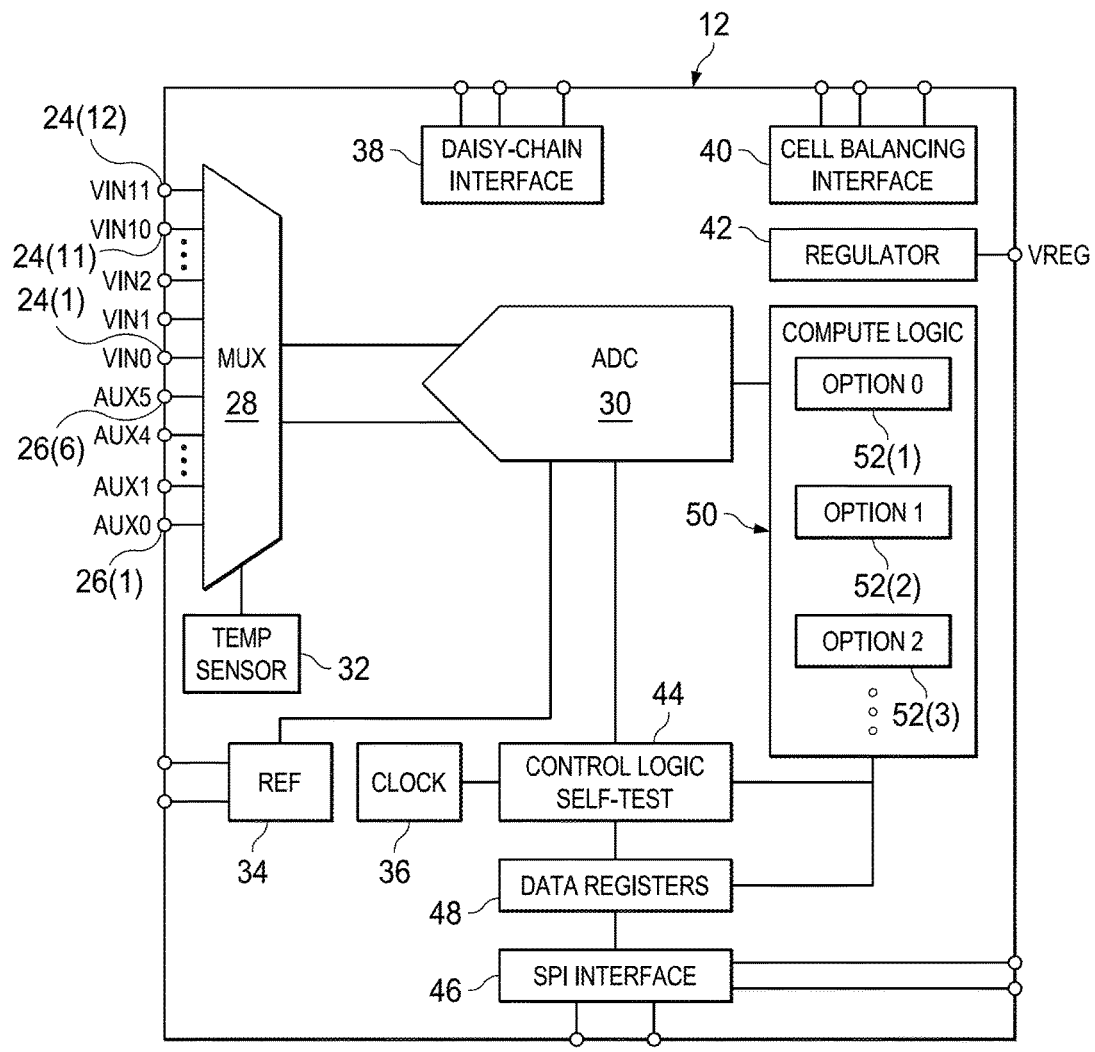
FIG. 2 is a simplified block diagram of example details of the system according to one embodiment.

Turning to FIG. 2, FIG. 2 is a simplified block diagram illustrating example details of an example battery monitor 12 according to an embodiment of system 10. Example battery monitor 12 includes input pins 24(1)-24(12) configured to receive cell voltage measurements from cells C in a specific battery pack (e.g., battery pack 14(1)). Auxiliary pins 26(1)-26(6) may be configured to receive auxiliary inputs. Input pins 24(1)-24(12) and auxiliary pins 26(1)-26(2) may be coupled to a multiplexer 28 that communicates with an ADC 30. A temperature sensor 32 may be configured to measure the temperature of example battery monitor 12. A reference block 34 may provide the reference voltage in example battery monitor 12. A clock 36 may provide a clock for appropriate signal processing as needed.

A daisy-chain interface 38 may be configured to receive signals from other battery monitors coupled to example battery monitor 12 in the daisy chain. Daisy-chain interface 38 can allow example battery monitor 12 to communicate with battery monitors immediately above and below it. Daisy-chain interface 38 can allow example battery monitor 12 to be electrically connected to micro-controller 16 without the need for individual isolation devices between each battery monitors. A cell balancing interface 40 may be configured to control discharging of individual cells as needed. A regulator 42 (e.g., linear differential output (LDO) regulator) may facilitate voltage regulation on example battery monitor 12. A control logic/self test module 44 may be configured to facilitate operations of ADC 30 as desired. Control logic/self test module 44 can be used to generate the ADC output code (among other functions). The output code can be stored in appropriate data registers 46 for the input from multiplexer 28 that has been converted by ADC 30.

A conversion of inputs received at input pins 24(1)-24(12) and auxiliary pins 26(1)-26(6) can be initiated on example battery monitor 12 using an appropriate input command from micro-controller 16. In some embodiments, the cell voltage of each individual cell can be measured by converting the difference between adjacent analog inputs 24(1)-24(12) and 26(1)-26(6). At the end of the first conversion, example battery monitor 12 may generate an internal end-of-conversion (EOC) signal. The internal EOC selects the next cell voltage inputs for measurement through multiplexer 28, and so on until all the selected voltage and auxiliary ADC inputs have been converted.

In various embodiments, multiplexer 28 may include a high voltage input multiplexer, and a low voltage input multiplexer. The high voltage multiplexer can allow several (e.g., 12) series-connected cells to be measured. The low voltage multiplexer may provide six single-ended ADC inputs that can be used in combination with external thermistors to measure the temperature of each cell. The auxiliary inputs monitored at auxiliary pins 26(1)-26(6) can also be used for external diagnostics in the application.

Compute logic 50 can include one or more of options 52(1) (option 0), 52(2) (option 1) and 52(3) (option 2). Additional or lesser number of options can be provided within the broad scope of the embodiments. Option 52(1) may represent a default option, where substantially all default data may be provided to micro-controller 16. In some embodiments, the default data may comprise 24 monitored and derivative properties including: 12 cell voltages, 6 auxiliary inputs, stack voltage, $V_{REF}$, $V_{REGIN}$, $V_{REGOUT}$, $V_{REFBUF}$, and temperature of example battery monitor 12. The 24 default data may be provided to micro-controller 16 on 24 channels in a single read back according to option 52(1).

Option 52(2) may represent the first compute logic option where minimum cell voltage, maximum cell voltage, average cell voltage and one of 24 default data are provided to micro-controller 16, such that the one of 24 default data is incremented sequentially in each read back, until all 24 default data have been provided to micro-controller 16 in 24 read backs. Option 52(3) may represent the second compute logic option where output on two channels are provided to micro-controller 16, where one of the two channels switches sequentially in consecutive read backs between minimum cell voltage, maximum cell voltage and average cell voltage; and the other of the two channels switches sequentially in consecutive read backs between the 24 default data.

According to various embodiments, compute logic 50 may perform calculations on monitored properties stored in data registers 46, for example, to calculate minimum cell voltage, maximum cell voltage and average cell voltage (in addition to computation of stack voltage and other derivative properties). Computer logic 50 may extract appropriate monitored and derivative properties to provide to micro-controller over SPI interface 48 according to selected option 52(1)-52(3). In various embodiments, micro-controller 16 may specify one of options 52(1)-52(3) in its command to example battery monitor 12.

In an experimental set up with example battery monitor 12, write to access the requested option 52(2) followed with reads from data registers 46 indicated a time of 1.6 ms @ 500 kHz fsclk as compared to 576 us @ 500 kHz fsclk for option 52(1) (i.e., the default option) for 1 register read from 8 battery monitors in the daisy chain, or 1.728 ms @ 500 kHz fsclk for 3 registers read from 8 battery monitors in the daisy chain. Option 52(2) reduced read back time by 128 us. If more pre-processed data is available, then efficiency can be further improved in comparison to a standard register read back, where merely the monitored properties are written and read back, without any additional computation.

Figure 3:
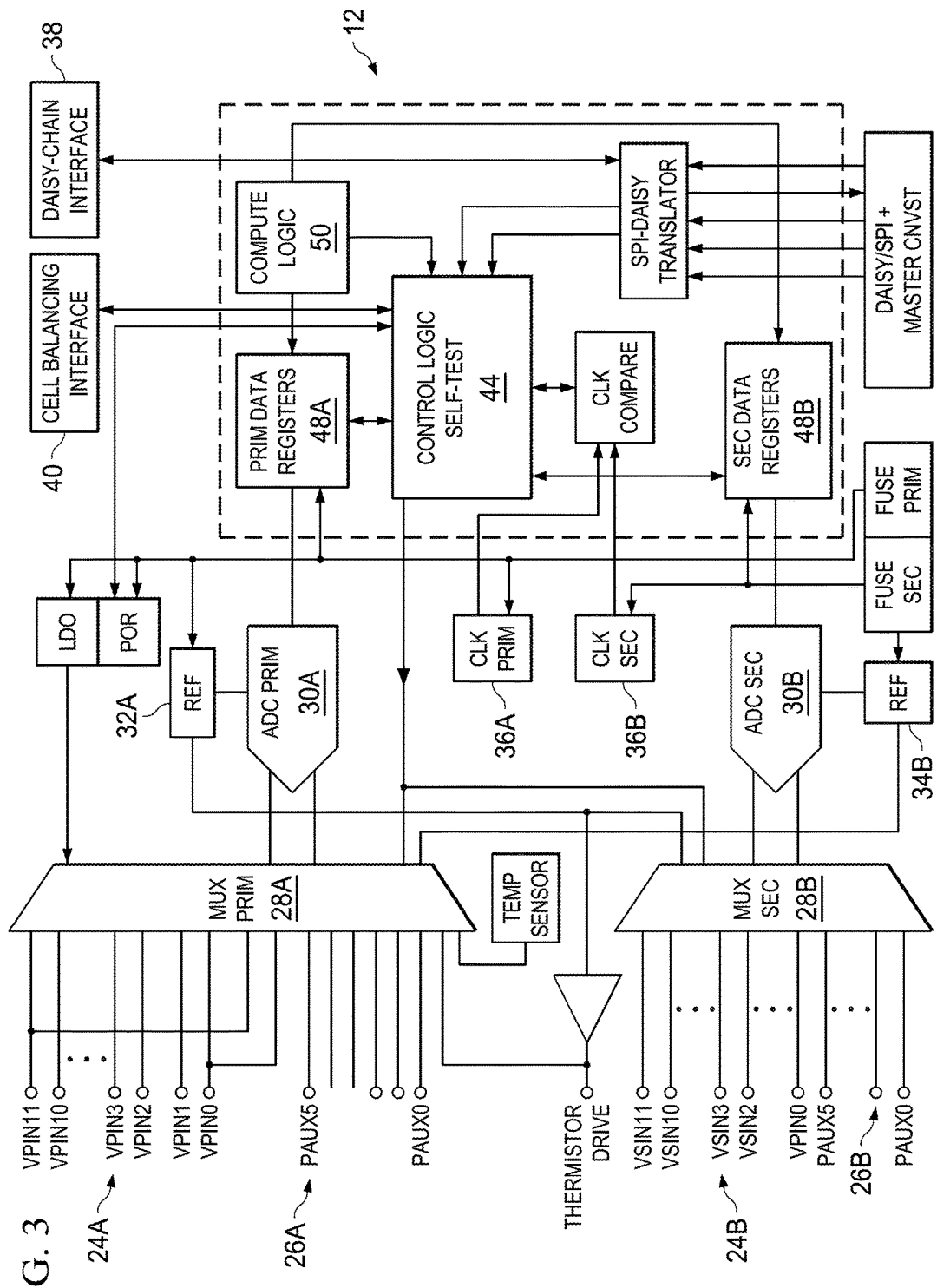
FIG. 3 is a simplified block diagram of other example details of the system according to one embodiment.

Turning to FIG. 3, FIG. 3 is a simplified block diagram illustrating example details of another embodiment of system 10. Example battery monitor 12 illustrated in the FIGURE includes a secondary set of components, to provide redundancy and fail-safe options in case of failure of a primary set of components. For example, example battery monitor 12 may include primary input pins 24A and secondary input pins 24B; primary auxiliary pins 26A and secondary auxiliary pins 26B; primary multiplexer 28A and secondary multiplexer 28B; primary ADC 30A and secondary ADC 30B; primary reference block 34A and secondary reference block 34B; primary clock 36A and secondary clock 36B; primary data registers 46A and secondary data registers 46B; and so on. Compute logic 50 may be coupled to both primary and secondary paths to perform the operations described herein. For example, compute logic 50 may read data from primary data registers 46A when the primary path is active; compute logic 50 may read data from secondary data registers 46B when the secondary path is active.

Turning to FIG. 4, FIG. 4 is a simplified diagram illustrating example details of data provided to micro-controller 16 according to the first compute logic option in an embodiment of system 10. In table 60, K represents the number of the read back; $C_K$ represents the calculated values of minimum cell voltage (MIN), maximum cell voltage (MAX) and average cell voltage (AVERAGE); and signal represents one of 24 default data (e.g., voltage of cell1 (CELL1), voltage of cell 2 (CELL2), . . . voltage of cell 12 (CELL12), stack voltages (CELL1+CELL2+ . . . +CELL12), auxiliary input 1 (AUX1), . . . auxiliary input 6 (AUX6), $V_{REG}$ (VREG), temperature from temperature sensor (TEMP SENSOR)). In read back 1 (K=1), the data provided to micro-controller 16 includes all three $C_K$ values of MIN, MAX and AVERAGE, and a first value of SIGNAL, namely CELL1.

In read back 2 (K=2), the data provided to micro-controller 16 includes all three $C_K$ values of MIN, MAX and AVERAGE, and next value of SIGNAL, namely CELL2. In the next consecutive read back 3 (K=3), the data provided to micro-controller 16 include all three $C_K$ values of MIN, MAX and AVERAGE, and next value of SIGNAL, namely CELL3, and so on until at the 24th read back, the data provided to micro-controller 16 include all three $C_K$ values of MIN, MAX and AVERAGE, and the last value of SIGNAL, namely, TEMP SENSOR. In the next read back, K may be reset to 1, and the data provided to micro-controller 16 may repeat appropriately. In the embodiment described in FIG. 4, as there are 24 SIGNAL values (representing 24 default data), they repeat after 24 read backs. In other embodiments, the repetition may follow the number of SIGNALS in the default data. For example, 12 SIGNAL values may be provided to micro-controller 16 in as many read backs.

Turning to FIG. 5, FIG. 5 is a simplified diagram illustrating example details of outputs provided to micro-controller 16 according to the first compute logic option in an embodiment of system 10. In table 62, K represents the number of the read back; $C_K$ represents the calculated values of minimum cell voltage (MIN), maximum cell voltage (MAX) and average cell voltage (AVERAGE); and signal represents the default data (e.g., voltage of cell1 (CELL1), voltage of cell 2 (CELL2), . . . voltage of cell 12 (CELL12), stack voltages (CELL1+CELL2+ . . . +CELL12), auxiliary input 1 (AUX1), . . . auxiliary input 6 (AUX6), regulated voltage (VREG), temperature from temperature sensor (TEMP SENSOR)). In read back 1 (K=1), the data provided to micro-controller 16 includes a first $C_K$ value of MIN, and a first value of SIGNAL, namely CELL1.

In read back 2 (K=2), the data provided to micro-controller 16 includes the next $C_K$ value of MAX, and next value of SIGNAL, namely CELL2. In the next consecutive read back 3 (K=3), the data provided to micro-controller 16 includes the next $C_K$ values of AVERAGE, and next value of SIGNAL, namely CELL3, and so on until at the 24th read back, the data provided to micro-controller 16 includes the last $C_K$ value of AVERAGE, and the last value of SIGNAL, namely, TEMP SENSOR. In the next read back, K may be reset to 1, and the data provided to micro-controller 16 may repeat appropriately. According to the embodiment, as there are 3 $C_K$ values (MIN, MAX and AVERAGE), $C_K$ values repeat after every 3rd read back (e.g., at read back 4, read back 7, etc.); as there are 24 SIGNAL values, SIGNAL values repeat after every 24 read backs. On the other hand, 12 (or 30 or any other number of) SIGNAL values may be provided to micro-controller 16 in as many read backs.

Turning to FIG. 6, FIG. 6 is a simplified flow diagram illustrating example operations that may be associated with an embodiment of system 10. Operations 100 include 102, at which a request for data may be received at example battery monitor 12 from micro-controller 16. The request may specify a compute logic option (e.g., option 0, option 1, option 2, etc.) for the requested data. At 104, battery monitor 12 may determine the requested compute logic option in the request. At 106, battery monitor 12 may receive measurements and other signals representing the monitored properties on all appropriate channels (e.g., input pins 24(1)-24 (12); auxiliary pins 26(1)-26(6), temperature, etc.).

At 108, battery monitor 12 may perform computations according to the requested option. The computations may include calculating derivative properties from the monitored properties, determining the default data to be provided to micro-controller 16, and dividing the default data into a plurality of portions. In an example embodiment, each portion may comprise one of the default data. In some embodiments, calculating derivative properties may be according to the requested option. For example, if the requested option is the first compute logic option, the calculated derivative properties may include $C_K$ and SIGNAL values according to table 60. On the other hand, if the requested option is the second compute logic option, the calculated derivative properties may include $C_K$ and SIGNAL values according to table 62. In other embodiments, substantially all derivative properties that can be derived from the monitored properties may be calculated. The determination of the default data may be made according to predetermined configurations in some embodiments. In other embodiments, the determination of the default data may be specified in the request from micro-controller 16.

At 110, a portion of the requested data may be sent to micro-controller 16. In embodiments where the computation at 108 is according to the option, the data sent to micro-controller 16 may include substantially all properties computed at 108 along with monitored properties, according to the option. For example, the computation at 108 according to the first option may include computing the minimum cell voltage, maximum cell voltage, and average cell voltage. The derivative parameters comprising minimum cell voltage, maximum cell voltage, and average cell voltage may be sent along with a portion of the default data at 110. In another example, the computation at 108 according to the second option may include computing the minimum cell voltage at a first request. The minimum cell voltage may be sent along with a portion of the default data at 110. In the next read back, the computation at 108 may include computing the maximum cell voltage, which may be sent with another portion of the default data at 110, and so on.

In other embodiments, wherein the calculation at 108 is not according to the option, the data sent to micro-controller 16 may be chosen from the computed properties and monitored properties according to the option. For example, the computation at 108 according to the second option may include computing the minimum cell voltage, maximum cell voltage, and average cell voltage. The derivative parameters comprising only the minimum cell voltage, may be sent along with a portion of the default data at 110 at the first read back. In the next read back, the maximum cell voltage may be selected from the computed minimum cell voltage, maximum cell voltage, and average cell voltage and sent to micro-controller 16 at 110, and so on. In some embodiments, outputs from one or more battery monitors 12(1)-12(N) may be provided to micro-controller 16 through the daisy-chain connections.

Turning to FIG. 6, FIG. 6 is a simplified flow diagram illustrating other example operations that may be associated with an embodiment of system 10. Operations 120 include 122 at which a value of K may be set or reset to 1. At 124, request for data may be received at example battery monitor 12. At 126, battery monitor 12 may receive measurements and other signals representing the monitored properties on all appropriate channels (e.g., input pins 24(1)-24(12); auxiliary pins 26(1)-26(6), temperature, etc.). At 128, battery monitor 12 may compute $C_K$ values of received signals. If the first compute logic option is requested by micro-controller 16, $C_K$ values are computed according to table 60; if the second compute logic option is requested by micro-controller 16, $C_K$ values are computed according to table 62. At 130, $C_K$ and SIGNAL values (according to table 60, or 62, as appropriate) may be sent to micro-controller 16. At 132, the value of K may be incremented by 1. At 134, a determination may be made if K is greater than 25. Is not, the operations revert to 124, and repeat until K reaches 25. When K reaches 25, K may be reset to 1 at 122, and the operations may repeat thereafter.

In the discussions of the embodiments above, capacitors, clocks, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, battery monitors 12(1)-12(N) and micro-controller 16 of the FIGURES are coupled to a motherboard of an associated electronic device. The motherboard can be a general circuit board that can hold various components of the internal electronic system of the electronic device and, further, provide connectors for other peripherals. More specifically, the motherboard can provide the electrical connections by which the other components of the system can communicate. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, controllers for video display, sound, and peripheral devices may be attached to the motherboard as plug-in cards, via cables, or integrated into the motherboard itself.

In another example embodiment, battery monitors 12(1)-12(N) and micro-controller 16 of the FIGURES may be embedded in stand-alone modules (e.g., a device with associated components and circuitry configured to perform a specific application or function) or integrated as plug-in modules into application specific hardware of electronic devices. Note that particular embodiments of the present disclosure may readily include a system on chip (SOC) central processing unit (CPU) package. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of chips located within a single electronic package and configured to interact closely with each other through the electronic package. In various other embodiments, the digital signal processing functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors and memory elements, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, for example, those that rely on synchronization signals to execute specialized software programs, or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can apply the functionalities described herein in high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the electrical circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In example embodiments, at least some portions of the activities outlined herein may be implemented in software (e.g., provided in a non-transitory media for performing activities discussed herein). In some embodiments, one or more of these features may be implemented in hardware, provided external to these elements, or consolidated in any appropriate manner to achieve the intended functionality. Battery monitors 12(1)-12(N) and micro-controller 16 may include software (or reciprocating software) that can coordinate in order to achieve the operations as outlined herein. In embodiments, these elements may include any suitable algorithms, hardware, software, components, modules, logic gates, integrated circuitry, interfaces, or objects that facilitate the operations thereof.

Furthermore, the components described and shown herein may also include suitable interfaces for receiving, transmitting, and/or otherwise communicating data. Additionally, some of the processors and memory elements associated with the various electronic elements may be removed, or otherwise consolidated such that a single processor and a single memory location are responsible for certain activities. In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In example embodiments, one or more memory elements (e.g., data registers 46) can store data used for the operations described herein. This includes the memory being able to store instructions (e.g., software, logic, code, etc.) that are executed to carry out the activities described in this Specification. A processor can execute any type of instructions associated with the data to achieve the operations detailed herein in this Specification. In one example, one or more processors (e.g., associated with battery monitor 12 or micro-controller 16) could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA)), an erasable programmable read only memory (EPROM), an EEPROM), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

Components of system 10 may further keep information in any suitable type of memory (e.g., random access memory (RAM), read only memory (ROM), FPGA, EPROM, EEPROM, etc.), software, hardware, or in any other suitable component, device, element, or object where appropriate and based on particular needs. The information being tracked, sent, received, or stored in system 10 could be provided in any database, register, table, cache, queue, control list, or storage structure, based on particular needs and implementations, all of which could be referenced in any suitable timeframe. Any of the memory items discussed herein should be construed as being encompassed within the broad term 'memory element.' Similarly, any of the potential processing elements, modules, and machines described in this Specification should be construed as being encompassed within the broad term 'processor.'

Although the present disclosure describes electrical architectures with reference to a micro-processor, the present disclosure contemplates electrical architectures described herein for use in any processor that can perform parallel operations, including a digital signal processor, a microcontroller, a general purpose computer, or any other processor that can perform parallel operations. Computer program logic implementing all or part of the functionality described herein is embodied in various forms, including, but in no way limited to, a source code form, a computer executable form, and various intermediate forms (for example, forms generated by an assembler, compiler, linker, or locator). In an example, source code includes a series of computer program instructions implemented in various programming languages, such as an object code, an assembly language, or a high-level language such as Fortran, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or non-transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies (e.g., Bluetooth), networking technologies, and internetworking technologies. The computer program may be distributed in any form as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web).

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL). Programmable logic may be fixed either permanently or non-transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the Internet or World Wide Web). Of course, some embodiments of the present disclosure may be implemented as a combination of both software (e.g., a computer program product) and hardware. Still other embodiments of the present disclosure are implemented as entirely hardware, or entirely software.

Note that with the numerous examples provided herein, interaction may be described in terms of two, three, four, or more electronic elements. However, this has been done for purposes of clarity and example only. It should be appreciated that the system can be consolidated in any suitable manner. Along similar design alternatives, any of the illustrated components, modules, devices, and elements of the FIGURES may be combined in various possible configurations, all of which are clearly within the broad scope of this Specification. In certain cases, it may be easier to describe one or more of the functionalities of a given set of flows by only referencing a limited number of electronic elements. It should be appreciated that communication system 10 of the FIGURES and its teachings are readily scalable and can accommodate a large number of components, as well as more complicated/sophisticated arrangements and configurations. Accordingly, the examples provided should not limit the scope or inhibit the broad teachings of communication system 10 as potentially applied to a myriad of other architectures.

It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Furthermore, the words "optimize," "optimization," and related terms are terms of art that refer to improvements in speed and/or efficiency of a specified outcome and do not purport to indicate that a process for achieving the specified outcome has achieved, or is capable of achieving, an "optimal" or perfectly speedy/perfectly efficient state.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes, Examples, and Implementations

Note that all optional features of the apparatus described above may also be implemented with respect to the method or process described herein and specifics in the examples may be used anywhere in one or more embodiments. In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for receiving a request from a micro-controller for data associated with one or more cells; means for receiving signals corresponding to monitored properties from the cells; means for calculating derivative properties from the monitored properties; means for dividing a default data into a plurality of portions; and means for sending the derivative properties and one of the portions of the default data to the micro-controller according to at least a first compute logic option or a second compute logic option. Some embodiments may include means for providing substantially all the default data sequentially to the micro-controller one portion at a time in as many consecutive read backs as a number of the portions, where each portion corresponds to the default data measured at a distinct time instant.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:
1. A method for reduced data handling in a battery monitoring system, comprising:
receiving, at a battery monitor communicatively coupled to a plurality of battery cells, data representative of a voltage of each of the plurality of battery cells;

determining, by the battery monitor based on the data, at least one of 1) a minimum value of the battery cell voltages, 2) a maximum value of the battery cell voltages, or 3) an average value of the battery cell voltages; and sending, by the battery monitor to a processing device, response data including at least one of 1) the minimum value, 2) the maximum value, or 3) the average value, wherein the response data further includes some but not all of the battery cell voltages.

2. The method of claim 1, wherein the battery monitor sends the some but not all of the battery cell voltages sequentially to the processing device one battery cell voltage at a time in as many consecutive output events as battery cell voltages in the some but not all battery cell voltages.

3. The method of claim 1, further comprising: monitoring, by the battery monitor, at least one of 1) auxiliary input, and 2) cross-check parameters used to perform safety checks on the battery monitor.

4. The method of claim 3, wherein the battery monitor monitors cross-check parameters, and the cross-check parameters include at least one of a reference output voltage ($V_{REF}$), an analog voltage output ($V_{REGOUT}$), an analog voltage input ($V_{REGIN}$), or a temperature of the battery monitor.

5. The method of claim 1, wherein the battery monitor sends the response data on multiple channels.

6. The method of claim 5, wherein the battery monitor sends the response data in a single frame.

7. The method of claim 1, wherein the battery monitor receives the data representative of the voltage of each of the plurality of battery cells wirelessly.

8. The method of claim 1, wherein the battery monitor sends the response data to the processing device wirelessly.

9. One or more non-transitory computer readable media having instructions stored thereon that, when executed by one or more processing devices of a battery monitor, cause the battery monitor to:

receive data representative of a voltage of each of a plurality of battery cells communicatively coupled to the battery monitor;

determine, based on the data, at least one of 1) a minimum value of the battery cell voltages, 2) a maximum value of the battery cell voltages, or 3) an average value of the battery cell voltages; and send, to a processing device, response data including at least one of 1) the minimum value, 2) the maximum value, or 3) the average value, wherein the response data further includes some but not all of the battery cell voltages.

10. The one or more non-transitory computer readable media of claim 9, wherein the response data includes the minimum value, the maximum value, and the average value sent in a single output event.

11. The one or more non-transitory computer readable media of claim 9, wherein the instructions are further to cause the battery monitor to send a different one of the minimum value, the maximum value, and the average value at different output events.

12. The one or more non-transitory computer readable media of claim 9, wherein the instructions that, when executed by the one or more processing devices of the battery monitor, cause the battery monitor to receive the data representative of the voltage of each of the plurality of battery cells are instructions that, when executed by the one or more processing devices of the battery monitor, cause the battery monitor to receive the data representative of the voltage of each of the plurality of battery cells wirelessly.

13. The one or more non-transitory computer readable media of claim 9, wherein the instructions that, when executed by the one or more processing devices of the battery monitor, cause the battery monitor to send the response data to the processing device are instructions that, when executed by the one or more processing devices of the battery monitor, cause the battery monitor to send the response data to the processing device wirelessly.

14. An apparatus, comprising:

a communication interface to receive data representative of a voltage of each of a plurality of battery cells, and to receive and transmit data from and to a processing device; and control circuitry to:

receive, via the communication interface, the data representative of the voltage of each of the plurality of battery cells;

determine, based on the data, at least one of 1) a minimum value of the battery cell voltages, 2) a maximum value of the battery cell voltages, or 3) an average value of the battery cell voltages; and send, via the communication interface to the processing device, response data including at least one of 1) the minimum value, 2) the maximum value, or 3) the average value, wherein the response data further includes some but not all of the battery cell voltages.

15. The apparatus of claim 14, wherein the communication interface includes a daisy chain interface to the processing device.

16. The apparatus of claim 14, wherein the control circuitry is to include voltages corresponding to different subsets of the plurality of battery cells at different output events.

17. The apparatus of claim 14, wherein the communication interface includes:

an analog-to-digital converter; and a plurality of input pins to receive the data representative of the voltages of each of the plurality of battery cells.

18. The apparatus of claim 17, further comprising:

a multiplexer;

wherein the input pins are coupled to the multiplexer to dynamically select a battery cell for monitoring.

19. The apparatus of claim 14, wherein the communication interface includes a wireless communication interface to receive the data representative of the voltages of each of the plurality of battery cells.

20. The apparatus of claim 14, wherein the communication interface includes a wireless communication interface to send the response data.

* * * * *